United States Patent
Matsui

(10) Patent No.: US 9,812,284 B2
(45) Date of Patent: *Nov. 7, 2017

(54) CHARGED PARTICLE BEAM DRAWING APPARATUS AND CHARGED PARTICLE BEAM DRAWING METHOD

(71) Applicant: NUFLARE TECHNOLOGY, INC., Yokohama-shi (JP)

(72) Inventor: Hideki Matsui, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/070,679

(22) Filed: Mar. 15, 2016

(65) Prior Publication Data
US 2016/0343535 A1    Nov. 24, 2016

(30) Foreign Application Priority Data
May 19, 2015  (JP) .................................. 2015-101953

(51) Int. Cl.
*H01J 37/147*    (2006.01)
*H01J 37/317*    (2006.01)

(52) U.S. Cl.
CPC ...... *H01J 37/1472* (2013.01); *H01J 37/3174* (2013.01); *H01J 2237/043* (2013.01);
(Continued)

(58) Field of Classification Search
CPC .............. H01J 37/1472; H01J 37/3174; H01J 2237/043; H01J 2237/103;
(Continued)

(56) References Cited

U.S. PATENT DOCUMENTS 8,872,139 B2 * 10/2014 Nishimura .......... H01J 37/3174
                                                                  250/252.1
9,147,553 B2 *  9/2015 Nishimura .......... H01J 37/3174

FOREIGN PATENT DOCUMENTS

JP         2000-306808       11/2000

* cited by examiner

*Primary Examiner* — Nicole Ippolito
(74) *Attorney, Agent, or Firm* — Oblon, McClelland, Maier & Neustadt, L.L.P.

(57) ABSTRACT

In one embodiment, a charged particle beam drawing apparatus deflects a charged particle beam with a deflector to draw a pattern. The apparatus includes a storage unit that stores an approximate formula indicating a correspondence relationship between a settling time for a DAC amplifier that controls the deflector, and a position shift amount, from a design position, of a drawn position of each evaluation pattern drawn on a first substrate while the settling time and an amount of deflection by the deflector are changed, a shot position correction unit that creates a correction formula indicating a relationship between an amount of deflection and a shot position shift amount at the settling time, from the approximate formula and the settling time for the DAC amplifier based on an amount of deflection of a shot, obtains a position correction amount by using the amount of deflection of the shot and the correction formula, and corrects a shot position defined by the shot data based on the position correction amount, and a drawing unit that performs drawing by using the shot data with a corrected shot position.

10 Claims, 6 Drawing Sheets

(52) U.S. Cl.
CPC . *H01J 2237/103* (2013.01); *H01J 2237/2485* (2013.01); *H01J 2237/3175* (2013.01)

(58) Field of Classification Search
CPC ....... H01J 2237/2485; H01J 2237/3175; H01J 2237/31715
USPC ... 250/492.1, 492.2, 492.21, 492.22, 492.23, 250/492.3
See application file for complete search history.

CHARGED PARTICLE BEAM DRAWING APPARATUS AND CHARGED PARTICLE BEAM DRAWING METHOD

CROSS REFERENCE TO RELATED APPLICATION

This application is based upon and claims benefit of priority from the Japanese Patent Application No. 2015-101953, filed on May 19, 2015, the entire contents of which are incorporated herein by reference.

FIELD

The present invention relates to a charged particle beam drawing apparatus and a charged particle beam drawing method.

BACKGROUND

With high integration of LSIs, a circuit line width required for a semiconductor device has been made to be very small year by year. In order to form a desired circuit pattern in a semiconductor device, a method is used in which by using a reduction projection type exposure apparatus, a high-accuracy original pattern (a mask, or in particular, one used by a stepper or a scanner is also referred to as reticle) formed on a quartz is reduced and transferred onto a wafer. The high-accuracy original pattern is drawn by an electron beam drawing apparatus, that is, an electron beam lithography technique is used.

In the electron beam drawing apparatus, drawing is performed by deflecting an electron beam with a deflector. A DAC (digital/analog converter) amplifier is used for the deflection of the electron beam. Examples of the role of such beam deflection with the DAC amplifier include control of the shape or size of a beam shot, control of the position of the shot, and blanking of the beam. If a settling time that is set for the DAC amplifier is short, an error occurs in an amount of movement due to deflection, so that a drawn position of the pattern shifts from a design position. On the other hand, if the settling time is too long, a throughput deteriorates. Thus, the settling time is set to be as short as possible such that a shift amount of the drawn position falls within an allowable range.

Hitherto, analog wave adjustment by replacing a resistor circuit is performed such that voltage fluctuation of the DAC amplifier is settled in a short time. However, the analog wave adjustment depends on a result of adjustment of the DAC amplifier alone based on an individual difference of the resistor circuit to be replaced, and it is difficult to shorten a settling time obtained from a result of actually drawing a pattern. For example, even if the resistor circuit is replaced such that rising of the voltage of the DAC amplifier is made earlier, a shift amount of the drawn position is varied due to this, so that a settable settling time may not be shortened. As described above, it is difficult to shorten the settling time by adjusting hardware of the DAC amplifier.

DETAILED DESCRIPTION

In one embodiment, a charged particle beam drawing apparatus deflects a charged particle beam with a deflector to draw a pattern. The apparatus includes a storage unit that stores an approximate formula indicating a correspondence relationship between a settling time for a DAC (digital/analog converter) amplifier that controls the deflector, and a position shift amount, from a design position, of a drawn position of each evaluation pattern drawn on a first substrate while the settling time and an amount of deflection of the charged particle beam by the deflector are changed, a shot data generation unit that converts drawing data to shot data configured with a shot of the charged particle beam as a unit, a shot position correction unit that creates a correction formula indicating a relationship between an amount of deflection and a shot position shift amount at the settling time, from the approximate formula and the settling time for the DAC amplifier based on an amount of deflection of a shot obtained from the shot data, obtains a position correction amount by using the amount of deflection of the shot and the correction formula, and corrects a shot position defined by the shot data on the basis of the position correction amount, and a drawing unit that performs drawing by applying the charged particle beam onto a second substrate by using the shot data with a corrected shot position.

Hereinafter, a configuration using an electron beam as an example of a charged particle beam in an embodiment will be described. However, the charged particle beam is not limited to the electron beam, and may be a beam using charged particles, such as an ion beam. In addition, a variable shaping type drawing apparatus will be described as an example of a charged particle beam drawing apparatus.

Figure 1:
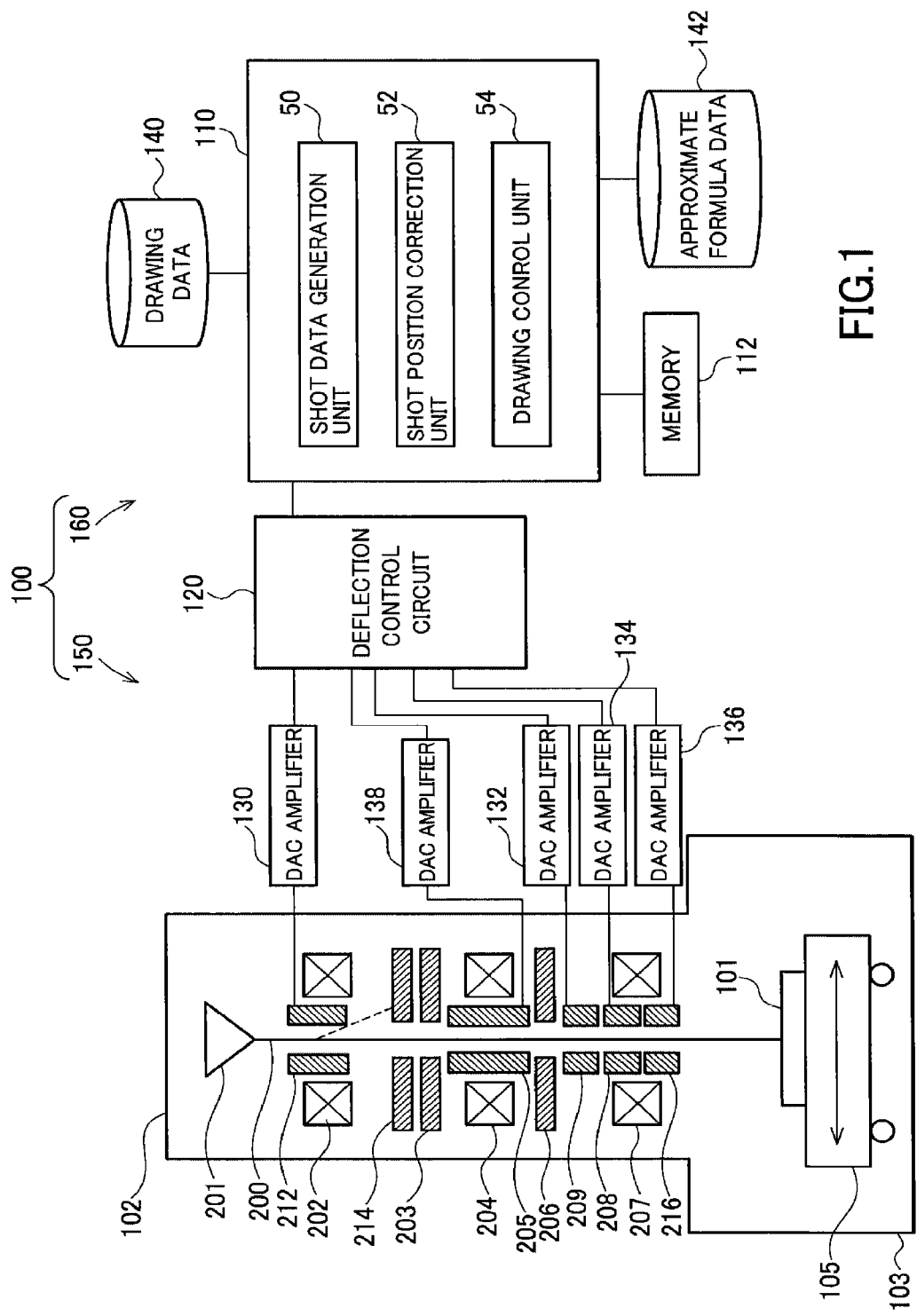
FIG. 1 is a schematic configuration diagram of a drawing apparatus according to an embodiment of the present invention.

FIG. 1 is a conceptual diagram showing the configuration of a drawing apparatus according to the embodiment. In FIG. 1, the drawing apparatus 100 includes a drawing unit 150 and a control unit 160. The drawing unit 150 includes an electron beam column 102 and a drawing chamber 103. Within the electron beam column 102, an electron gun 201, an illumination lens 202, a blanking deflector (blanker) 212, a blanking aperture 214, a first shaping aperture 203, a projection lens 204, a shaping deflector 205, a second shaping aperture 206, an objective lens 207, a main deflector 208, a sub deflector 209, and a sub sub deflector 216 are disposed.

Within the drawing chamber 103, an XY stage 105 which is movable at least in an XY direction is disposed. A substrate 101 which is a drawing target is disposed on the XY stage 105. The substrate 101 includes a mask for exposure, a silicon wafer, and the like which are used for manufacturing a semiconductor device. The mask includes a mask blank.

The control unit 160 includes a control computer 110, a memory 112, a deflection control circuit 120, DAC (digital/analog converter) amplifiers 130, 132, 134, 136, and 138 (deflection amplifiers), and storage devices 140 and 142 such as magnetic disk devices. The control computer 110, the memory 112, the deflection control circuit 120, and the storage devices 140 and 142 are connected to each other via a bus that is not shown.

The DAC amplifiers 130, 132, 134, 136, and 138 are connected to the deflection control circuit 120. The DAC amplifier 130 is connected to the blanking deflector 212. The DAC amplifier 132 is connected to the sub deflector 209. The DAC amplifier 134 is connected to the main deflector 208. The DAC amplifier 136 is connected to the sub sub deflector 216. The DAC amplifier 138 is connected to the shaping deflector 205.

The control computer 110 includes a shot data generation unit 50, a shot position correction unit 52, and a drawing control unit 54. The respective functions of the shot data generation unit 50, the shot position correction unit 52, and the drawing control unit 54 may be configured by software or may be configured by hardware. When implemented in software, a program that realizes at least part of functions of the control computer 110 may be stored on a recording medium such as a flexible disk or CD-ROM and read and executed by a computer. Results of calculation by the control computer 110 are stored in the memory 112 every calculation.

Figure 2:
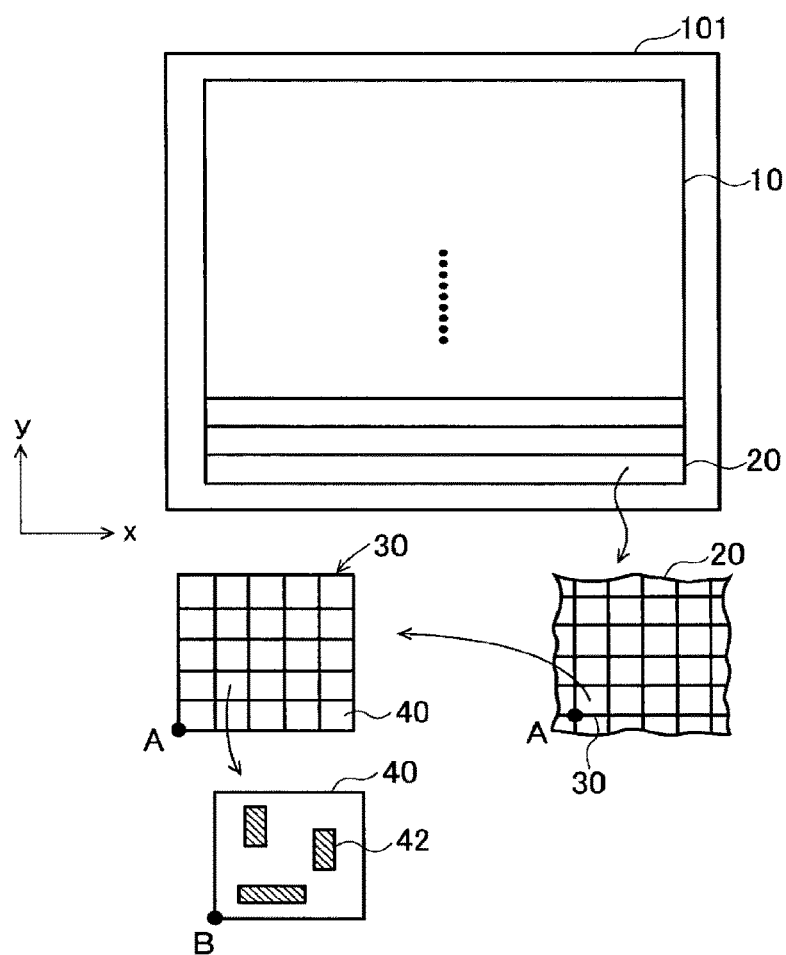
FIG. 2 is a conceptual diagram illustrating deflection regions.

FIG. 2 is a conceptual diagram illustrating deflection regions. In FIG. 2, a drawing area 10 of a sample 101 is virtually divided, for example, in a y direction into a plurality of strip-shaped stripe regions 20 each having a width with which deflection by the main deflector 208 is possible. Regions into which each stripe region 20 is divided in an x direction and each of which has a width with which deflection by the main deflector 208 is possible are deflection regions (main deflection regions) of the main deflector 208.

Each main deflection region is virtually divided in a mesh shape into a plurality of sub fields (SFs) 30 each having a size in which deflection by the sub deflector 209 is possible. Each SF 30 is virtually divided in a mesh shape into a plurality of under-sub fields (here, referred to as "TF" by using the abbreviation for Tertiary Deflection Field which means third deflection. The same applies hereinafter) 40 each having a size in which deflection by the sub sub deflector 216 is possible.

A shot figure is drawn at each shot position 42 in each TF 40. As described above, by the three stages of the deflectors that deflect an electron beam 200, the respective deflection regions are the main deflection regions, the SFs 30, and the TFs 40 having different region sizes to be deflected, in order of a larger size.

A digital signal for blanking control is inputted from the deflection control circuit 120 to the DAC amplifier 130. At the DAC amplifier 130, the digital signal is converted to an analog signal, amplified, and applied as a deflection voltage to the blanking deflector 212. The electron beam 200 is deflected by the deflection voltage, and blanking control of each shot is performed.

A digital signal for shaping deflection is outputted from the deflection control circuit 120 to the DAC amplifier 138. At the DAC amplifier 138, the digital signal is converted to the analog signal, amplified, and applied as a deflection voltage to the deflector 205. By the deflection voltage, the electron beam 200 is deflected to a specific position in the second shaping aperture 206, and an electron beam having a desired dimension and shape is formed.

A digital signal for main deflection control is outputted from the deflection control circuit 120 to the DAC amplifier 134. The DAC amplifier 134 converts a digital signal to an analog signal, amplifies the analog signal, and applies the analog signal as a deflection voltage to the main deflector 208. By the deflection voltage, the electron beam 200 is deflected, and a beam of each shot is deflected to a reference position A (for example, the central position or the lower left corner position of the corresponding SF) in a predetermined sub field (SF) virtually divided in a mesh shape. In the case where drawing is performed while the XY stage 105 continuously moves, the deflection voltage also includes a deflection voltage for tracking which follows the stage movement.

A digital signal for sub deflection control is outputted from the deflection control circuit 120 to the DAC amplifier 132. The DAC amplifier 132 converts the digital signal to an analog signal, amplifies the analog signal, and applies the analog signal as a deflection voltage to the sub deflector 209. By the deflection voltage, the electron beam 200 is deflected, and the beam of each shot is deflected to a reference position B (for example, the central position or the lower left corner position of the corresponding TF) in the TF 40 which is a minimum deflection region.

A digital signal for sub sub deflection control is outputted from the deflection control circuit 120 to the DAC amplifier 136. The DAC amplifier 136 converts the digital signal to an analog signal, amplifies the analog signal, and applies the analog signal as a deflection voltage to the sub sub deflector 216. By the deflection voltage, the electron beam 200 is deflected, and the beam of each shot is deflected to each shot position 42 within the TF 40.

In the drawing apparatus 100, a drawing process proceeds for each stripe region 20 by using a plurality of stages of deflectors. Here, as an example, three stages of deflectors including the main deflector 208, the sub deflector 209, and the sub sub deflector 216, are used. While the XY stage 105 continuously moves, for example, in the −x direction, drawing proceeds to the x direction for the first stripe region 20. Then, after end of the drawing for the first stripe region 20, drawing for the second stripe region 20 proceeds similarly or in the opposite direction. Thereafter, similarly, drawing for the third and subsequent stripe regions 20 proceeds.

The main deflector 208 deflects the electron beam 200 sequentially to the reference position A in each SF 30 so as to follow the movement of the XY stage 105. In addition, the sub deflector 209 deflects the electron beam 200 sequentially from the reference position A in each SF 30 to the reference position B in each TF 40. Then, the sub sub deflector 216 deflects the electron beam 200 from the reference position B in each TF 40 to each shot position 42 of the beam applied within the TF 40.

As described above, the main deflector 208, the sub deflector 209, and the sub sub deflector 216 have deflection regions having different sizes. Each TF 40 is a minimum deflection region among the deflection regions of the plurality of stages of deflectors.

Figure 3:
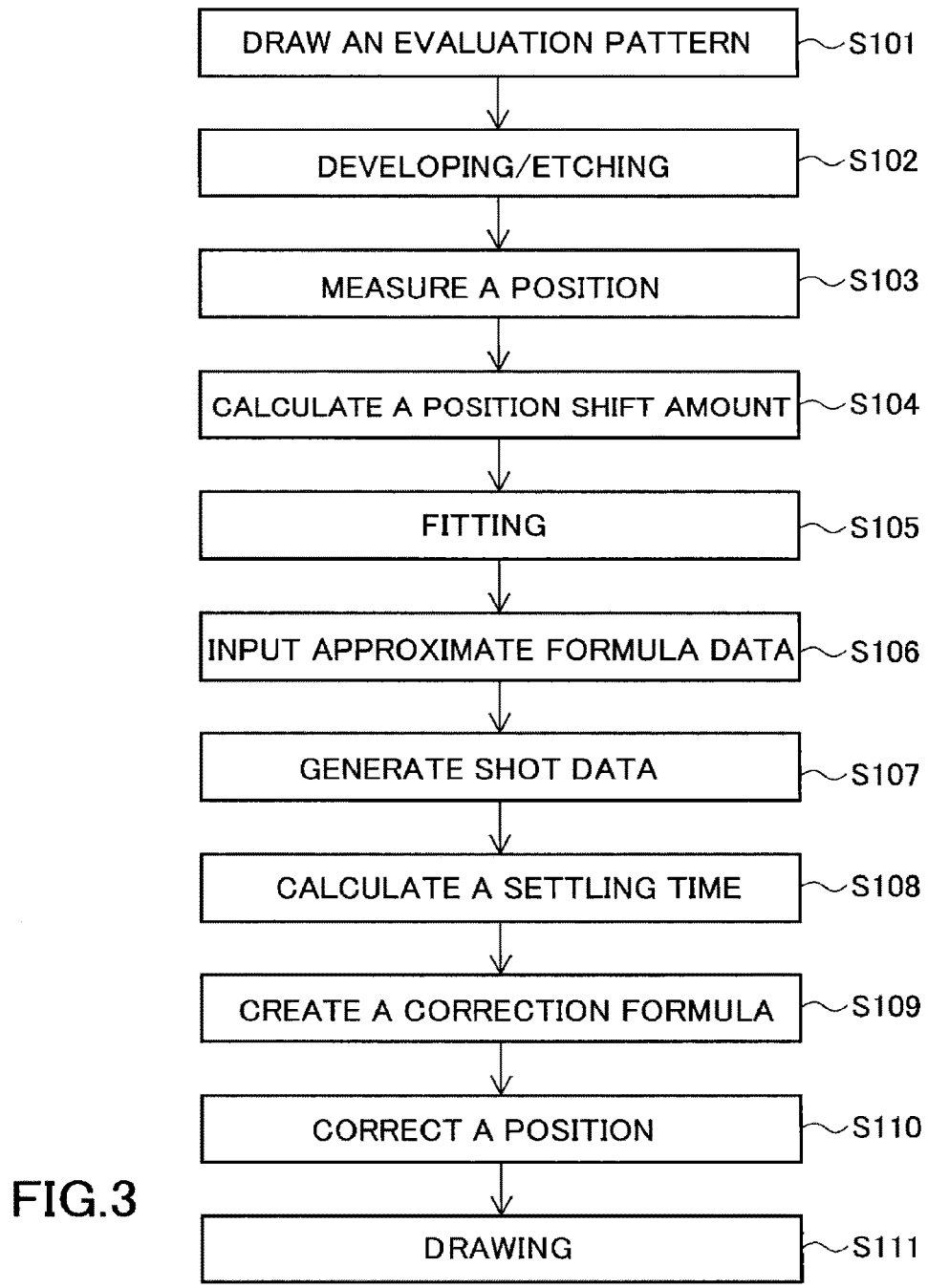
FIG. 3 is a flowchart illustrating a drawing method according to the embodiment.

FIG. 3 is a flowchart illustrating a drawing method according to the present embodiment. In an evaluation pattern drawing step (step S101), an evaluation pattern is drawn on an evaluation substrate by the drawing apparatus 100. As the evaluation substrate, for example, a substrate is used in which a light-shielding film such as a chromium (Cr) film is formed on a glass substrate and a resist film is formed on the light-shielding film. The evaluation pattern is drawn while the settling time for the DAC amplifier 136 and an amount of deflection (amount of beam movement) by the sub sub deflector 216 are changed.

For example, the evaluation pattern is drawn while the amount of deflection is changed such that the amount of deflection is small or large in each of the x direction and the y direction. For example, a minimum movement amount of beam (for example, 0.1 μm) within the TF 40 is set as a small amount of deflection, and a maximum movement amount of beam (for example, 0.6 μm) within the TF 40 is set as a large amount of deflection. Thus, an evaluation pattern composed of a plurality of patterns in which the settling time for the DAC amplifier 136 and the amount of deflection by the sub sub deflector 216 are different is drawn on the evaluation substrate.

In a developing/etching step (step S102), the evaluation substrate having the evaluation pattern drawn thereon is developed, and a resist pattern is formed thereon. Then, the exposed light-shielding film is etched with the resist pattern as a mask. Then, the resist pattern is removed by ashing or the like, thereby forming a pattern of the light-shielding film on the evaluation substrate.

In a position measuring step (step S103), the position of the evaluation pattern (light-shielding film pattern) formed on the evaluation substrate is measured by using a pattern position measuring instrument.

Figure 4:
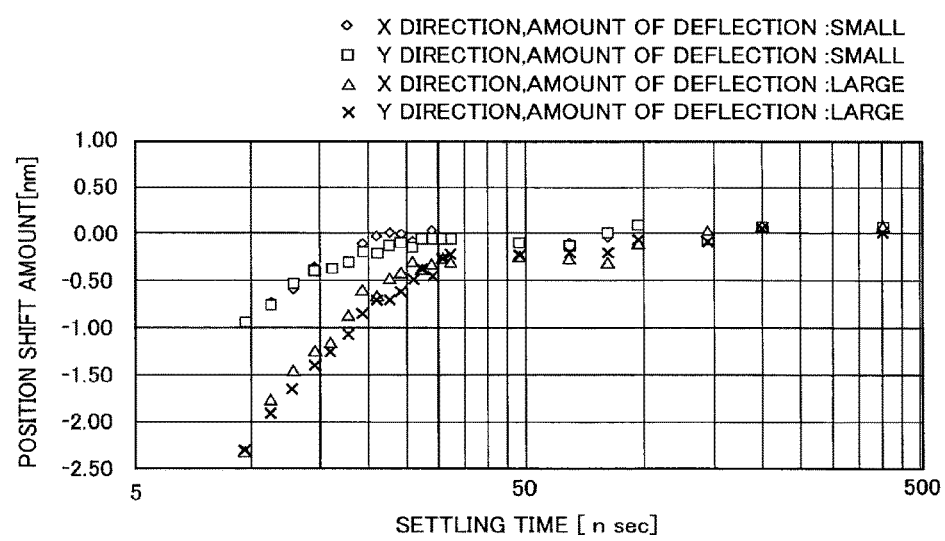
FIG. 4 is a graph showing an example of results of measurement of the position of an evaluation pattern.

In a position shift amount calculating step (step S104), a position shift amount calculation unit that is not shown calculates a position shift amount from a design position for each pattern the position of which has been measured in step S103. FIG. 4 is a graph showing an example of a relationship between the settling time and the calculated position shift amount. The position shift amount increases as the settling time shortens.

Figure 5:
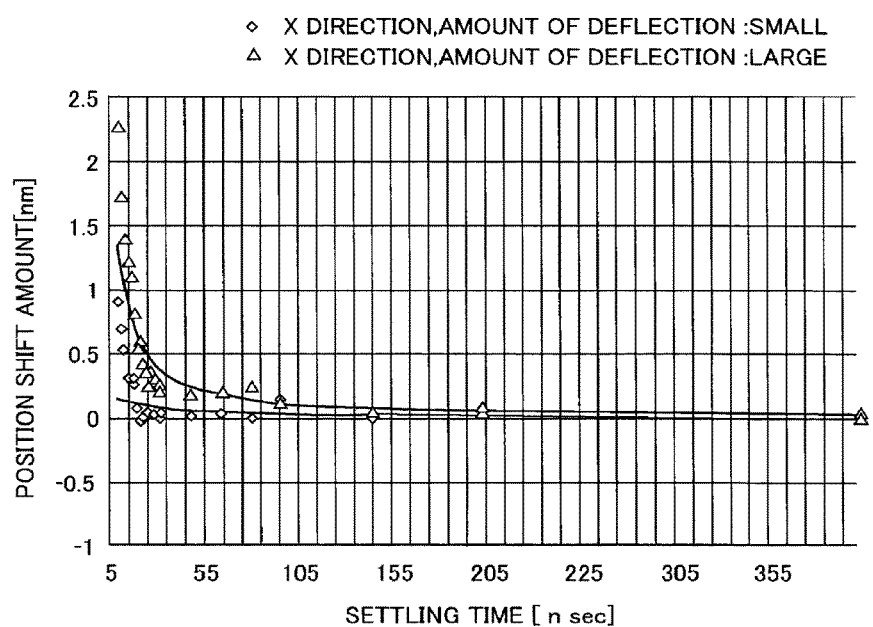
FIG. 5 is a graph showing an example of an approximate formula.

In a fitting step (step S105), as shown in FIG. 5, the horizontal axis indicates the settling time, the vertical axis indicated the absolute value of the position shift amount of the drawn evaluation pattern, and approximation is performed with a polynomial expression. The approximate formula is obtained for each direction and amount of deflection. When an evaluation pattern is drawn with the magnitude of the amount of deflection being changed for the x direction and the y direction, four approximate formulas are obtained. FIG. 5 shows a graph of an approximate formula when the amount of deflection in the x direction is large and a graph of an approximate formula when the amount of deflection in the x direction is small. The obtained approximate formula data is inputted to the drawing apparatus 100 and stored in the storage device 142 (step S106).

In a shot data generating step (step S107), the shot data generation unit 50 performs a plurality of stages of data conversion processing on drawing data stored in the storage device 140, divides each figure pattern to be drawn, into a shot figure having a size in which irradiation is possible at a single shot, and generates shot data in a format specific to the drawing apparatus. As shot data, for example, a figure code indicating the figure type of each shot figure, a figure size, and a drawn position, etc. are defined for each shot.

In a settling time calculating step (step S108), the drawing control unit 54 obtains an amount of deflection from the shot data of each shot, and calculates a settling time ST for the DAC amplifier 136. A mathematical expression for calculating a settling time from an amount of deflection is stored in the drawing apparatus 100 beforehand, and the drawing control unit 54 inputs the amount of deflection for each shot to this mathematical expression to calculate the settling time ST.

Figure 6:
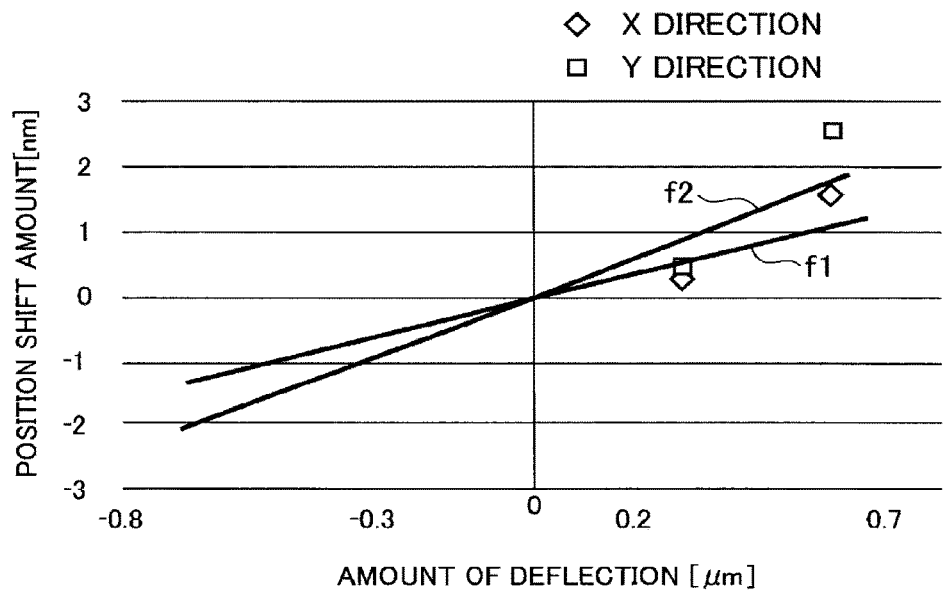
FIG. 6 is a graph showing an example of a correction formula.

In a correction formula creating step (step S109), the shot position correction unit 52 inputs the settling time ST calculated in step S108, to the approximate formula stored in the storage device 142 to obtain a position shift amount. For example, by inputting the settling time ST to each of the four approximate formulas described above, two position shift amounts in each of the x direction and the y direction, that is, four position shift amounts, are obtained as shown in FIG. 6. From the two position shift amounts in the x direction, a correction formula f1 indicating a relationship between the amount of deflection in the x direction and the position shift amount in the case where the settling time is ST, is obtained. In addition, from the two position shift amounts in the y direction, a correction formula f2 indicating a relationship between the amount of deflection in the y direction and the position shift amount in the case where the settling time is ST, is obtained. Each of the correction formulas f1 and f2 is represented as a linear function in which the position shift amount is 0 nm when the amount of deflection is 0 μm.

In a position correcting step (step S110), the shot position correction unit 52 inputs the amount of deflection for each shot to the correction formulas f1 and f2, thereby obtaining a position shift amount Δx in the x direction and a position shift amount Δy in the y direction for each shot. The position shift amount (Δx, Δy) is a shift amount of a shot position assumed if the shot is made with the settling time ST as it is. The shot position correction unit 52 performs calculation with, as a drawn position after correction, a position (X-ΔX, Y-Δy) obtained by subtracting the shift amount (position correction amount) from a drawn position coordinate (x, y) on design of each shot.

In a drawing step (step S111), a drawing process is performed by using the shot data the shot position of which has been corrected by the shot position correction unit 52. The drawing control unit 54 outputs the corrected drawn position to the deflection control circuit 120 per shot. The deflection control circuit 120 calculates deflection data for drawing at the corrected position. Then, the deflection control circuit 120 outputs the calculated deflection data to the DAC amplifier 136 for the sub sub deflector 216 that deflects the beam to a relative position within the TF 40.

In addition, the deflection control circuit 120 outputs deflection data providing an irradiation time for a required irradiation amount, to the DAC amplifier 130 for the blanking deflector 212. The deflection control circuit 120 outputs the deflection data to the DAC amplifier 134 for the main deflector 208 such that the beam follows movement of the XY stage 105. The deflection control circuit 120 outputs the deflection data to the DAC amplifier 132 for the sub deflector 209 that deflects the beam to a relative position within the SF 30. Moreover, the deflection control circuit 120 outputs the deflection data to the DAC amplifier 138 for the shaping deflector 205 such that the beam has a desired shape.

When passing through the interior of the blanking deflector 212, the electron beam 200 emitted from the electron gun 201 (emission unit) is deflected by the blanking deflector 212, for example, in a beam ON state such that the electron beam 200 passes through the blanking aperture 214, and in a beam OFF state such that the entire beam is blocked by the blanking aperture 214. The electron beam 200 that passes through the blanking aperture 214 after the state shifts from beam OFF to beam ON until the state becomes beam OFF makes a single electron beam shot.

The electron beam 200 of each shot that is generated by passing through the blanking deflector 212 and the blanking aperture 214 as described above illuminates the entire first shaping aperture 203 having a rectangular hole by the illumination lens 202. Here, first, the electron beam 200 is shaped into a rectangular shape.

The electron beam 200 of a first aperture image having passed through the first shaping aperture 203 is projected onto the second shaping aperture 206 by the projection lens 204. Deflection of the first aperture image on the second shaping aperture 206 is controlled by the shaping deflector 205, whereby it is possible to change the beam shape and dimension (perform variable shaping). Such variable shaping is performed for each shot, so that it is possible to shape the beam into a different shape and dimension for each shot.

The electron beam 200, of a second aperture image, having passed through the second shaping aperture 206 is focused by the objective lens 207, is deflected by the main deflector 208 and the sub deflector 209, and is applied to a desired position on the sample 101 disposed on the XY stage 105 that continuously moves. As described above, a plurality of shots of the electron beam 200 are sequentially deflected by each deflector onto the sample 101, which is to be a substrate.

As described above, according to the present embodiment, the settling time for each shot is inputted to each approximate formula obtained from the results of drawing of the evaluation pattern, to create the correction formulas (f1, f2), the amount of deflection is inputted to the correction formula to obtain a shift amount of a shot position, and a drawn position is corrected by subtracting the shift amount from the drawn position coordinate on design. By correcting a position shift depending on the settling time, it is possible to shorten a settable settling time, and it is possible to improve a throughput.

Figure 7:
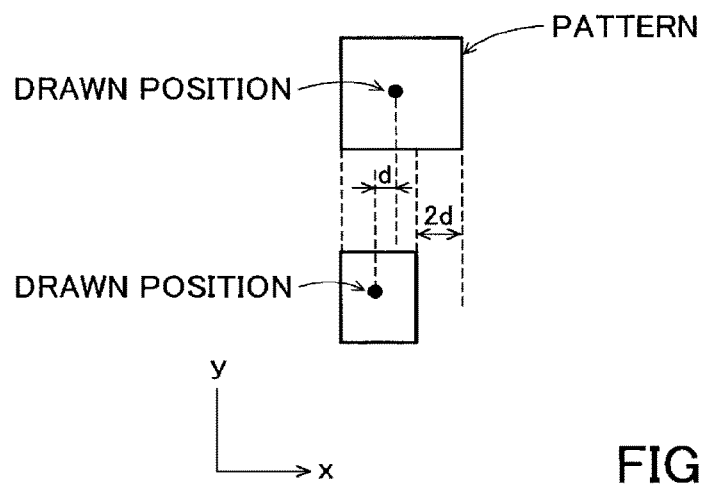
FIG. 7 is a diagram showing an example of variation of a drawn position.

The drawn position of the beam by the drawing apparatus 100 is variable during a shot. Thus, in the fitting step (step S105) in the above-described embodiment, in calculating an approximate formula, a settling time as well as a shot time may be taken into account. As shown in FIG. 7, normally, the center (center of gravity) of a pattern is measured as the drawn position of the pattern. Here, if the width of the drawn pattern is smaller in the x direction than the designed value by 2 d, the variation amount of the drawn position of the pattern is d. That is, the variation amount of the drawn position is half of the variation amount of the drawn pattern.

Therefore, if a settling time as well as a shot time is taken into account, half of the shot time is preferably added to the settling time. In this case, an approximate formula is obtained with the horizontal axis of the graph in FIG. 5 as settling time+shot time/2.

In addition, in the correction formula creating step (step S109), a time obtained by summing up the settling time ST and half of the shot time for each shot is inputted to the approximate formula to obtain two position shift amounts in each of the x direction and the y direction, and correction formulas f1 and f2 are obtained. As described above, by also taking the shot time into account, the position shift amount during the shot is corrected, and it is possible to draw a pattern at a position having higher accuracy.

In the above-described embodiment, the evaluation pattern is drawn with two kinds of the amounts of deflection in each of the x direction and the y direction. However, an evaluation pattern may be drawn with three or more kinds of amounts of deflection. In this case, each of the correction formulas f1 and f2 is obtained from three or more points, so that the correction formulas f1 and f2 having higher accuracy are obtained.

In the above-described embodiment, the correction formulas f1 and f2 at various settling times may be created beforehand by using the approximate formula obtained from the results of drawing of the evaluation pattern, and may be stored as a correction formula table in a storage unit. In this case, the correction formulas f1 and f2 corresponding to the settling time ST for each shot are extracted from the correction formula table, and a correction amount of the shot position is calculated by inputting the amount of deflection for each shot to the extracted correction formulas.

In the above-described embodiment, the example of correcting the position shift amount depending on the settling time for the DAC amplifier 136 for the sub sub deflector 216 has been described, but application to correction of a position shift amount depending on the settling time for the DAC amplifier 132 for the sub deflector 209 is possible. In this case, in the evaluation pattern drawing step (step S101), for example, the evaluation pattern is drawn with the amount of deflection changed such that the minimum movement amount and the maximum movement amount of the beam by the sub deflector 209 within the SF 30 are obtained.

In the above-described embodiment, each unit, for example the shot data generation unit 50, includes a processing circuitry. The processing circuitry includes an electric circuit, a computer, a processor, a circuit board, a quantum circuit, or a semiconductor device. The processing circuitry may be used for plural units. Each unit may include a processing circuitry different from each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam drawing apparatus for deflecting a charged particle beam with a deflector to draw a pattern, the charged particle beam drawing apparatus comprising:
   a storage unit that stores an approximate formula indicating a correspondence relationship between a settling time for a DAC (digital/analog converter) amplifier that controls the deflector, and a position shift amount, from a design position, of a drawn position of each evaluation pattern drawn on a first substrate while the settling time and an amount of deflection of the charged particle beam by the deflector are changed;
   a shot data generation unit that converts drawing data to shot data configured with a shot of the charged particle beam as a unit;
   a shot position correction unit that creates a correction formula indicating a relationship between an amount of deflection and a shot position shift amount at the settling time, from the approximate formula and the settling time for the DAC amplifier based on an amount of deflection of a shot obtained from the shot data, obtains a position correction amount by using the amount of deflection of the shot and the correction formula, and corrects a shot position defined by the shot data on the basis of the position correction amount; and
   a drawing unit that performs drawing by applying the charged particle beam onto a second substrate by using the shot data with a corrected shot position.

2. The apparatus according to claim 1, wherein
   the approximate formula indicates a correspondence relationship between a position shift amount, from the design position, of a drawn position of each evaluation pattern drawn on the first substrate and a time obtained by adding half of a shot time of each evaluation pattern to the settling time, and the shot position correction unit creates the correction formula from the approximate formula and a time obtained by adding half of the shot time to the settling time for the DAC amplifier based on the amount of deflection of the shot obtained from the shot data.

3. The apparatus according to claim 1, wherein the evaluation pattern is drawn with at least two kinds of amounts of deflection in each of a first direction and a second direction perpendicular to the first direction, and the storage unit stores the approximate formula for deflection direction and amount of deflection.

4. The apparatus according to claim 3, wherein the two kinds of amounts of deflection are a maximum amount of deflection and a minimum amount of deflection by the deflector.

5. The apparatus according to claim 1, wherein the deflector includes two or more stages of deflectors having different deflection region sizes, and the approximate formula is obtained from an evaluation pattern drawn on the first substrate while a settling time for a DAC amplifier that controls the deflector having a deflection region size that is not maximum and an amount of deflection of the charged particle beam by the deflector are changed.

6. The apparatus according to claim 5, wherein the deflector includes three stages of deflectors, and the approximate formula is obtained from an evaluation pattern drawn on the first substrate while a settling time for a DAC amplifier that controls the deflector having a minimum deflection region size and an amount of deflection of the charged particle beam by the deflector are changed.

7. A charged particle beam drawing method for deflecting a charged particle beam with a deflector to draw a pattern, the charged particle beam drawing method comprising:

storing, in a storage unit, an approximate formula indicating a correspondence relationship between a settling time for a DAC (digital/analog converter) amplifier that controls the deflector, and a position shift amount, from a design position, of a drawn position of each evaluation pattern drawn on a first substrate while the settling time and an amount of deflection of the charged particle beam by the deflector are changed;

converting drawing data to shot data configured with a shot of the charged particle beam as a unit;

creating a correction formula indicating a relationship between an amount of deflection and a shot position shift amount at the settling time, from the approximate formula and the settling time for the DAC amplifier based on an amount of deflection of a shot obtained from the shot data, obtaining a position correction amount by using the amount of deflection of the shot and the correction formula, and correcting a shot position defined by the shot data on the basis of the position correction amount; and applying the charged particle beam onto a second substrate by using the shot data with a corrected shot position, to perform drawing.

8. The method according to claim 7, wherein the approximate formula indicates a correspondence relationship between a position shift amount, from the design position, of a drawn position of each evaluation pattern drawn on the first substrate and a time obtained by adding half of a shot time of each evaluation pattern to the settling time, and the correction formula is created from the approximate formula and a time obtained by adding half of the shot time to the settling time for the DAC amplifier based on the amount of deflection of the shot obtained from the shot data.

9. The method according to claim 7, wherein the evaluation pattern is drawn with at least two kinds of amounts of deflection in each of a first direction and a second direction perpendicular to the first direction, and the approximate formula for deflection direction and amount of deflection is stored in the storage unit.

10. The method according to claim 9, wherein the two kinds of amounts of deflection are a maximum amount of deflection and a minimum amount of deflection by the deflector.

* * * * *